(12) United States Patent
Rozenblit et al.

(10) Patent No.: US 9,209,839 B2
(45) Date of Patent: Dec. 8, 2015

(54) METHOD OF ANTENNA IMPEDANCE MISMATCH COMPENSATION BASED ON TIME-TO-DIGITAL CONVERTER PHASE ESTIMATION

(71) Applicant: BROADCOM CORPORATION, Irvine, CA (US)

(72) Inventors: Dmitriy Rozenblit, Irvine, CA (US); Tirdad Sowlati, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 405 days.

(21) Appl. No.: 13/910,959

(22) Filed: Jun. 5, 2013

(65) Prior Publication Data

US 2014/0313088 A1 Oct. 23, 2014

Related U.S. Application Data

(60) Provisional application No. 61/813,131, filed on Apr. 17, 2013.

(51) Int. Cl.
*H01Q 9/06* (2006.01)
*H04B 1/04* (2006.01)
*H03H 7/40* (2006.01)

(52) U.S. Cl.
CPC ............... *H04B 1/0458* (2013.01); *H03H 7/40* (2013.01)

(58) Field of Classification Search
CPC ................................ H04B 1/0458; H03H 7/40
USPC ......................................................... 333/17.3
See application file for complete search history.

(56) References Cited

U.S. PATENT DOCUMENTS

| | | | |
|---|---|---|---|
| 8,565,695 B2* | 10/2013 | Bonnet ..................... | H01P 5/18 333/17.3 |
| 2011/0254638 A1* | 10/2011 | Manssen .................. | H03H 7/40 333/109 |
| 2012/0256698 A1* | 10/2012 | De Foucauld ........ | H04B 1/0458 333/17.3 |
| 2013/0038403 A1* | 2/2013 | Colleoni ............. | H04L 25/0272 333/109 |

* cited by examiner

*Primary Examiner* — Stephen E Jones
*Assistant Examiner* — Scott S Outten
(74) *Attorney, Agent, or Firm* — McDermott Will & Emery LLP

(57) ABSTRACT

A method for an antenna mismatch compensation may include determining an amplitude ratio by measuring a ratio of amplitudes of a reflected signal and an incident signal of an antenna tuning circuit coupled to an antenna. A time difference between the reflected signal and the incident signal may be measured. The time difference may be converted to a phase difference. A topology and one or more parameters of the antenna tuning circuit may be determined based on the amplitude ratio and the phase difference so that the antenna tuning circuit compensates for the antenna mismatch.

20 Claims, 3 Drawing Sheets

METHOD OF ANTENNA IMPEDANCE MISMATCH COMPENSATION BASED ON TIME-TO-DIGITAL CONVERTER PHASE ESTIMATION

CROSS-REFERENCE TO RELATED APPLICATIONS

This application claims the benefit of priority under 35 U.S.C. §119 from U.S. Provisional Patent Application 61/813,131 filed Apr. 17, 2013, which is incorporated herein by reference in its entirety.

TECHNICAL FIELD

The present description relates generally to communications, and more particularly, but not exclusively, to a method of antenna impedance mismatch compensation based on time-to-digital converter phase estimation.

BACKGROUND

Antennas are integral parts of every communication system. For instance, radio-frequency (RF) antennas in the form of a single antenna or multiple antennas are commonly used in RF communication devices such as portable communication devices (e.g., mobile phones, tablets, phablets, etc.) The antenna may be coupled to the power amplifier (PA) of the transmit (TX) chain and the front end of the receive (RX) chain via a duplexer. An efficient power transfer from the PA to the antenna and from the antenna to the RX chain can take place if impedance mismatch between the PA and the antenna and between the antenna and the RX chain are reduced to near zero. Existing antenna tuners may not be able to compensate for antenna impedance mismatch with a low insertion loss and in conditions that prediction of the changes in the TX output power and the phase shift of the TX signal are nearly impossible.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more implementations. In one or more instances, well-known structures and components are shown in block diagram form in order to avoid obscuring the concepts of the subject technology.

Figure 1A:
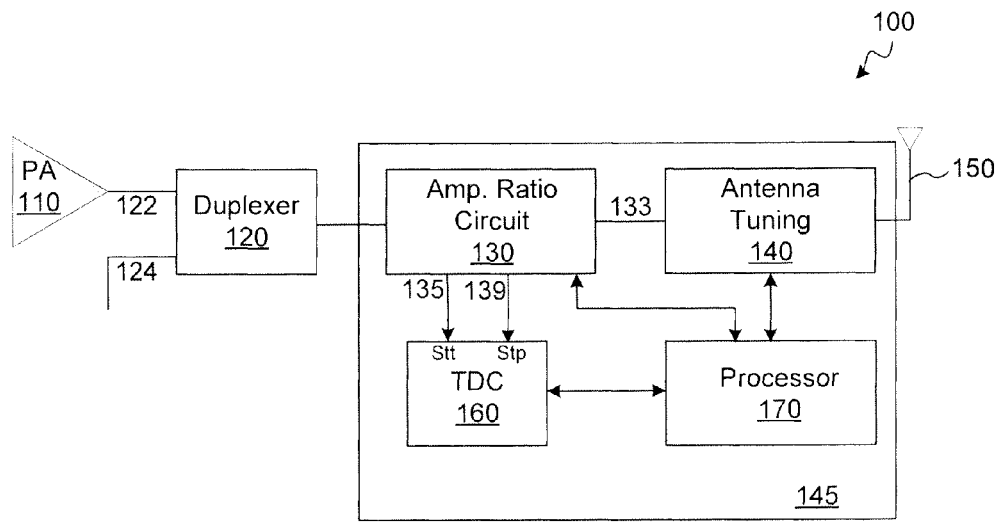
FIG. 1A illustrates an example of a transmitter including an antenna mismatch compensation device in accordance with one or more implementations.

FIG. 1A illustrates an example of a transmitter 100 including an antenna mismatch compensation device 145 in accordance with one or more implementations of the subject technology. The transmitter 100 includes a power amplifier 110, a duplexer circuit 120, the antenna mismatch compensation device 145, and a radio-frequency (RF) antenna 150. The antenna mismatch compensation device 145 includes an amplitude ratio circuit 130, an antenna tuning circuit 140, a time-to-digital converter 160, and a processor 170. The transmitter 100 may include a number of other components and modules, which are not shown here for simplicity. For example, the transmitter 100 may include one or more up-conversion mixers, variable-gain amplifiers (VGAs), digital-to-analog converters (DACs), etc. In one or more aspects, the transmitter 100 may be a wireless transmitter.

It is understood that the impedance mismatch between the antenna 150 and the duplexer circuit 120 may result in significant losses in both the transmit (TX) chain and the receive (RX) chain coupled, respectively, to ports 122 and 124 of the duplexer circuit 120. The antenna tuning by using the antenna tuning circuit 140 can improve the power consumption of the TX and RX chains. This is a significant achievement, in particular, for hand-held communication devices where the long battery lifetime is paramount. The main complexity in antenna tuning may arise from a challenge to accurately select the optimal settings of the antenna tuning circuit 140 with a predictable change in insertion loss (which can be critically important for the TX chain) between the tuning steps and a minimum amount of required intermediate steps (which can be important for both the response/mismatch correction time as well as for keeping low power consumption of the supporting circuitry).

The subject technology may use an amplitude ratio and a phase difference between an incident signal and a reflected signal at an input of the antenna tuning circuit 140 (which is coupled to an output port 133 of the amplitude ratio circuit 130) to control parameters of the antenna tuning circuit 140. The controlling of the parameters of the antenna tuning circuit 140 may be performed such that the antenna mismatch (e.g., a mismatch between the impedance of the RF antenna 150 and the output impedance of the duplexer circuit 120) is substantially compensated for. The controlling of the parameters of the antenna tuning circuit 140 may be performed dynamically and in real-time to prevent any change in the TX output power and phase shift of the TX signal of the PA 110, which may not be predictable, from affecting the proper antenna impedance matching. The amplitude ratio may be defined as the ratio of the amplitudes of the incident and reflected signals at the input node (e.g., 133) of the antenna tuning circuit 140, and is measured by the amplitude ratio circuit 130. The TDC 160, coupled between coupled port 135 and a node 139 (see FIG. 1B) of the amplitude ratio circuit 130, can measure a time difference between the incident signal and the reflected signal at the output port 133 of the amplitude ratio circuit 130. The time difference between the incident signal and the reflected signal can then be converted to phase difference between the incident signal and the reflected signal. The processor 170 may perform the conversion, for example, by using the following formula:

$$\Delta\phi(\text{degrees}) = (\Delta t / T_0 * 360) \quad (1)$$

where $\Delta\phi$ is the phase difference corresponding to a time difference $\Delta t$, and $T_0$ is the period corresponding to the operating frequency of the transmitter. In one or more implementations, the TDC may be calibrated to output a value for the phase difference (e.g., $\Delta\phi$) calculated based on the formula (1), instead of the value of the time difference (e.g., $\Delta t$).

The TDC 160 may, for example, convert the time interval between two rising edges of the incident and reflected signals to a digital number, which is a measure of time difference between the two signals. In one or more aspects, the TDC 160 may be implemented by a delay-line TDC, which can use inverters or buffers to measure the quantized delay between the rising edges of the signals connected to the start and stop inputs of the TDC. The start (e.g., Stt) and stop (e.g., Stp) inputs of the TDC 160 may be coupled to the incident and reflected signals from the coupled port 135 and the isolated port 137 of the amplitude ratio circuit 130. In one or more implementations, the stop input of the TDC 160 may be connected to an internal node of the amplitude ratio circuit 130 that is coupled to the isolated port 137 through a gain stage. Other TDC circuits such as a Vernier Delay Line TDC may be used, which may provide a resolution of sub-gate delay (e.g., ps range). For example, a TDC with a modest 10 ps resolution can measure a phase difference of 3.6° between two 1 GHz signals.

The processor 170 may use the measured amplitude ratio and phase difference to determine a topology and one or more parameters of the antenna tuning circuit 140, so that the antenna tuning circuit 140 can compensate for the antenna mismatch. In one or more implementations, the processor 170 may be a baseband processor or other processor available to the transmitter 100. The processor 170 may comprise suitable logic, circuitry, and/or code that may enable processing data and/or controlling operations of the transmitter 100. In this regard, the processor 170 may be enabled to provide control signals to various other portions of transmitter 100. The processor 170 may also control transfers of data between various portions of the transmitter 100. Additionally, the processor 360 may enable implementation of an operating system or otherwise execute code to manage operations of the transmitter 100.

Figure 1B:
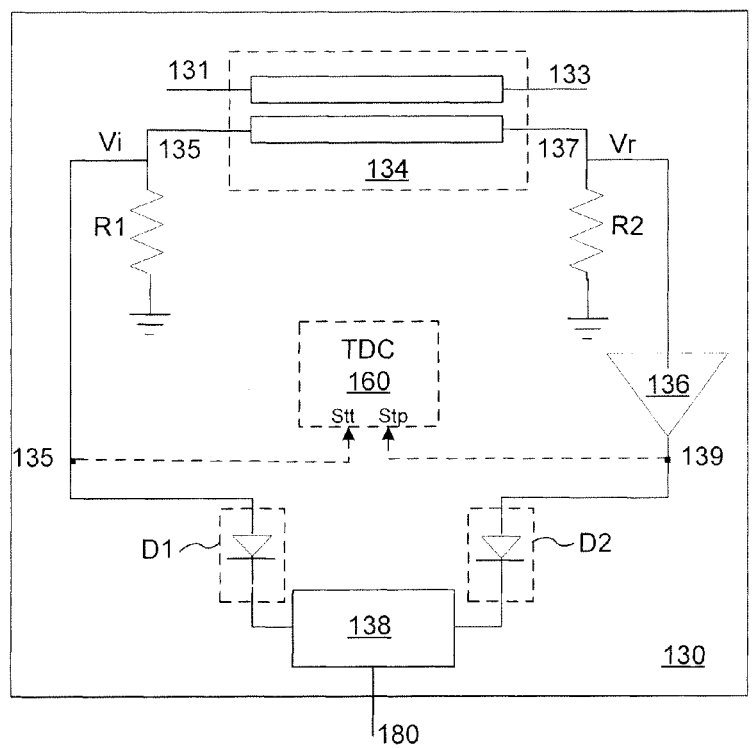
FIG. 1B illustrates an example of the amplitude ratio circuit of FIG. 1A in accordance with one or more implementations.

FIG. 1B illustrates an example of the amplitude ratio circuit of FIG. 1A in accordance with one or more implementations of the subject technology. The amplitude ratio circuit 130 may include a coupler 134, resistors R1 and R2, a gain stage 136, detectors D1 and D2, and the combiner circuit 138. The TDC 160 of FIG. 1A is also shown with broken lines in FIG. 1B, as being coupled between nodes 135 and 139, to further clarify that timing (e.g., phase) and amplitude information are taken from the same nodes (e.g., 135 and 139). The coupler 134 may be a directional coupler with input and output ports 131 and 133 coupled, respectively to the duplexer 120 of FIG. 1A and the input node of the antenna tuning circuit 140 of FIG. 1A. The coupled and isolated ports 135 and 137 of the coupler are coupled to ground potential through resistors R1 and R2 and provide incident voltage signal Vi and reflected voltage signal Vr to detectors D1 and D2. The reflected voltage signal Vr is amplified by the gain stage 136, before being received, at the node 139 (which may also be connected to the stop input of the TDC 160 of FIG. 1A), by the detector D2. This is to optimize the accuracy of the amplitude ratio measurement. The accuracy may be achieved at a targeted output return loss (RL). With a chosen value of the amplifier gain, the signals at the detectors' inputs as well as at TDC inputs (e.g., nodes 135 and 139) can be at substantially identical levels for the targeted output RL. For integrated circuit implementation, the behavior of the TDC 160 and detectors D1 and D2 can be very similar for the same amplitude level (e.g., less affected by AM/PM and non-linearities).

In one or more implementations, the detectors D1 and D2 may be linear or logarithmic envelope detectors. The detector output signals are provided to the combiner circuit 138. In the combiner circuit 138, the detector signal may first be converted to digital numbers (e.g., using 10 bit ADCs) and subtracted or divided, depending on the type of the detectors D1 and D2. For example, if the detectors D1 and D2 are logarithmic detectors, the detector signal are subtracted (e.g., the signal from detector D2 is subtracted from the signal from detector D1), and if the detectors D1 and D2 are linear detectors, the detector signal are divided (e.g., the signal from detector D1 is divided by the signal from detector D2). In one or more aspects, the detector output signals may be converted to digital before the combiner circuit 138. The output signal 180 of the amplitude ratio circuit 130 represents a ratio of amplitudes of the reflected voltage signal Vr and the incident voltage signal Vi. It is understood that the output signal 180 can be calibrated to take into account the amplification of the gain stage 136 into the amplitude ratio determination.

The ratio of amplitudes (e.g., represented by output signal 180) along with the phase difference discussed above with respect to FIG. 1A may be used by the processor 170 of FIG. 1A to determine a topology and one or more parameters of the antenna tuning circuit 140 so that the antenna tuning circuit 140 compensates for the antenna mismatch.

Figure 2A:
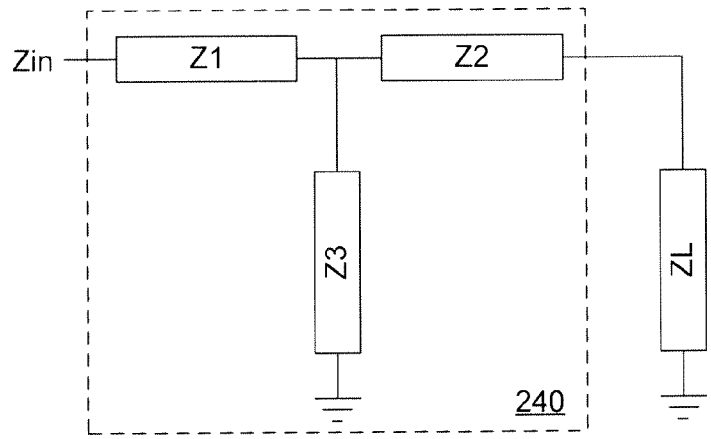
FIGS. 2A-2C illustrate examples of antenna tuning circuits of the transmitter of FIG. 1 in accordance with one or more implementations.
Figure 2B:
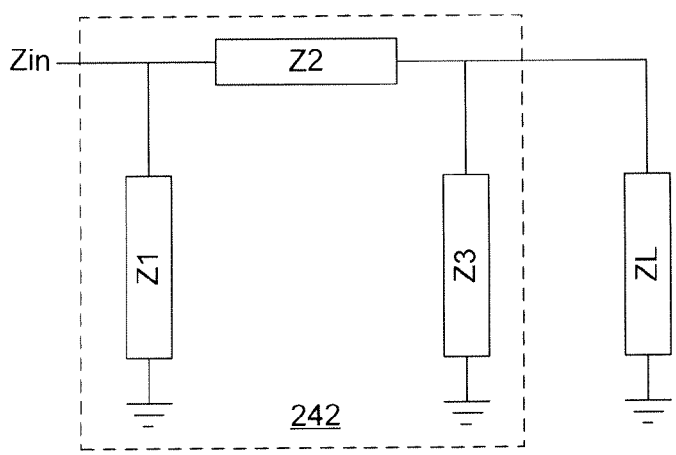
Figure 2C:
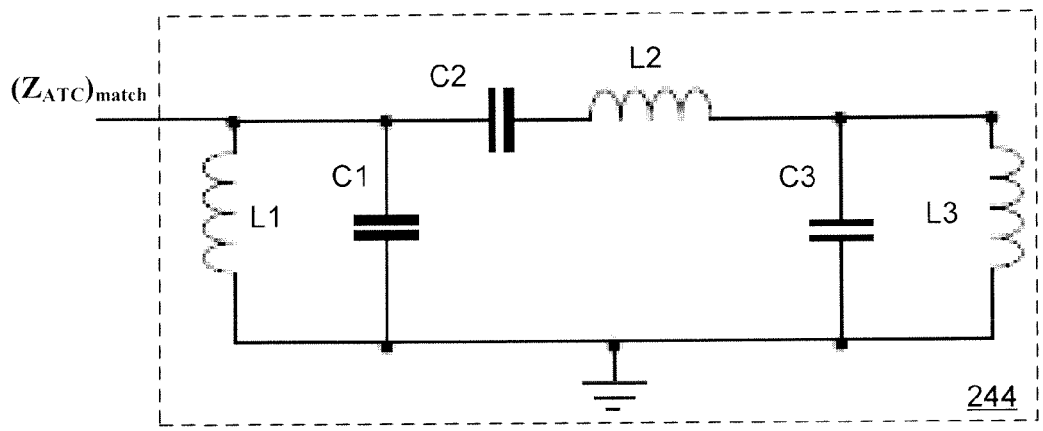

FIGS. 2A-2C illustrate examples of antenna tuning circuits 140 of the transmitter 100 of FIG. 1 in accordance with one or more implementations of the subject technology. The antenna tuning circuit 140 may be implemented by using topologies including a T-network and a Π-network, as shown in the antenna tuning circuit 240 and 242, respectively. The impedances Z1, Z2, and Z3 may represent parallel or series coupled inductances and capacitors. The impedance $Z_L$ represents an impedance of the RF antenna 150 of FIG. 1A and the impedance $Z_{in}$ is the input impedance of the antenna tuning circuit (e.g., 240 or 242) when coupled to the RF antenna 150. It is known that the impedance $Z_{in}$ may be determined if the ratio of amplitudes of the reflected and incident signal and the phase difference between the incident and reflected signal at the input of the antenna tuning circuit is known. Knowing the ratio of amplitudes and the phase difference, the impedance $Z_{in}$ may be manually determined from a Smith Chart or determined by the processor 170 of FIG. 1A using known algorithms.

Once the impedance $Z_{in}$ for a certain antenna tuning circuit (e.g., 240 or 242) with known values of the impedances Z1, Z2, and Z3 is determined, the actual value of the impedance ZL of the antenna 150 can be determined from:

$$Z_L = (Z_{ATC} Z_{in})(Z_{ATC} - Z_{in}) \quad (2)$$

Where $Z_{ATC}$ is the impedance of the antenna tuning circuit (e.g., 240 or 242), which is known as the values of the impedances Z1, Z2, and Z3 are known. The knowledge of the antenna impedance (e.g., $Z_L$), while mismatched, may allow setting/calculation of the settings of the antenna tuning circuit 140 that could be optimum for either TX chain (frequency) or RX chain (frequency) or a compromise for both.

For example, once the impedance $Z_L$ of the antenna 150 is determined, the topology and parameters of the antenna tuning circuit can be determined so that the impedance $Z_L$ is matched with the impedance ($Z_D$) of the duplexer circuit 120, thereby achieving the main objective of the present disclosure. The condition for impedance matching between the antenna tuning circuit coupled to the antenna and the duplexer circuit 120 can be expressed as:

$$(Z_{in})_{match}{}^* = Z_D \qquad (3)$$

Where the $(Z_{in})_{match}{}^*$ represents the complex conjugate of $(Z_{in})_{match}$, which is the desired value (e.g., matching value) for $Z_{in}$. Therefore, knowing $Z_D$, $(Z_{in})_{match}$ is known, which can be used in equation (2) to calculate the desired impedance (e.g., matching impedance) $(Z_{ATC})_{match}$ for the antenna tuning circuit (e.g., 240 or 242).

Knowing the value of matching impedance $(Z_{ATC})_{match}$ for the antenna tuning circuit, the processor 170 can determine a topology that can best be fitted to that value based on known characteristics of available topologies. In one or more implementations, the topology determined by the processor 170 may not be exactly the T- or the Π-network. For example, the topology determined by the processor 170 may be a Π-network without the second leg (e.g., Z3). Once the topology is known, the parameters of the antenna tuning circuit may be determined.

In one or more implementation, the Π-network antenna tuning circuit 242 may be implemented by the circuit 244 of FIG. 2C. In the circuit 244, the impedances Z1, Z2, and Z3 of the antenna tuning circuit 242 are, respectively, represented by the parallel connected L1 and C1, series connected L2 and C2, and parallel connected L3 and C3 elements. For the circuit 244 to match the impedance $Z_L$ of the antenna 150 to the impedance $Z_D$ of the duplexer circuit 120, the input impedance has to be tuned to $(Z_{ATC})_{match}$. To achieve this goal, the values of the inductances L1, L2, and L3 are set to some known values and the values of the capacitors are adjusted to provide the desired input impedance (e.g., $(Z_{ATC})_{match}$). The capacitors may be implemented by array capacitors, which can be digitally adjusted by the processor 170. Therefore, the subject technology facilitates adjustment of the antenna tuning circuit to match the impedance of the antenna to the impedance of the duplexer, while avoiding any need for exhaustive searches. Further, the adjustment of the antenna tuning circuit can be performed dynamically and in real time so that any change in the TX output power and phase shift of the TX signal from the PA 110 of FIG. 1A, which may not be predictable, is prevented from affecting the proper antenna impedance matching.

Figure 3:
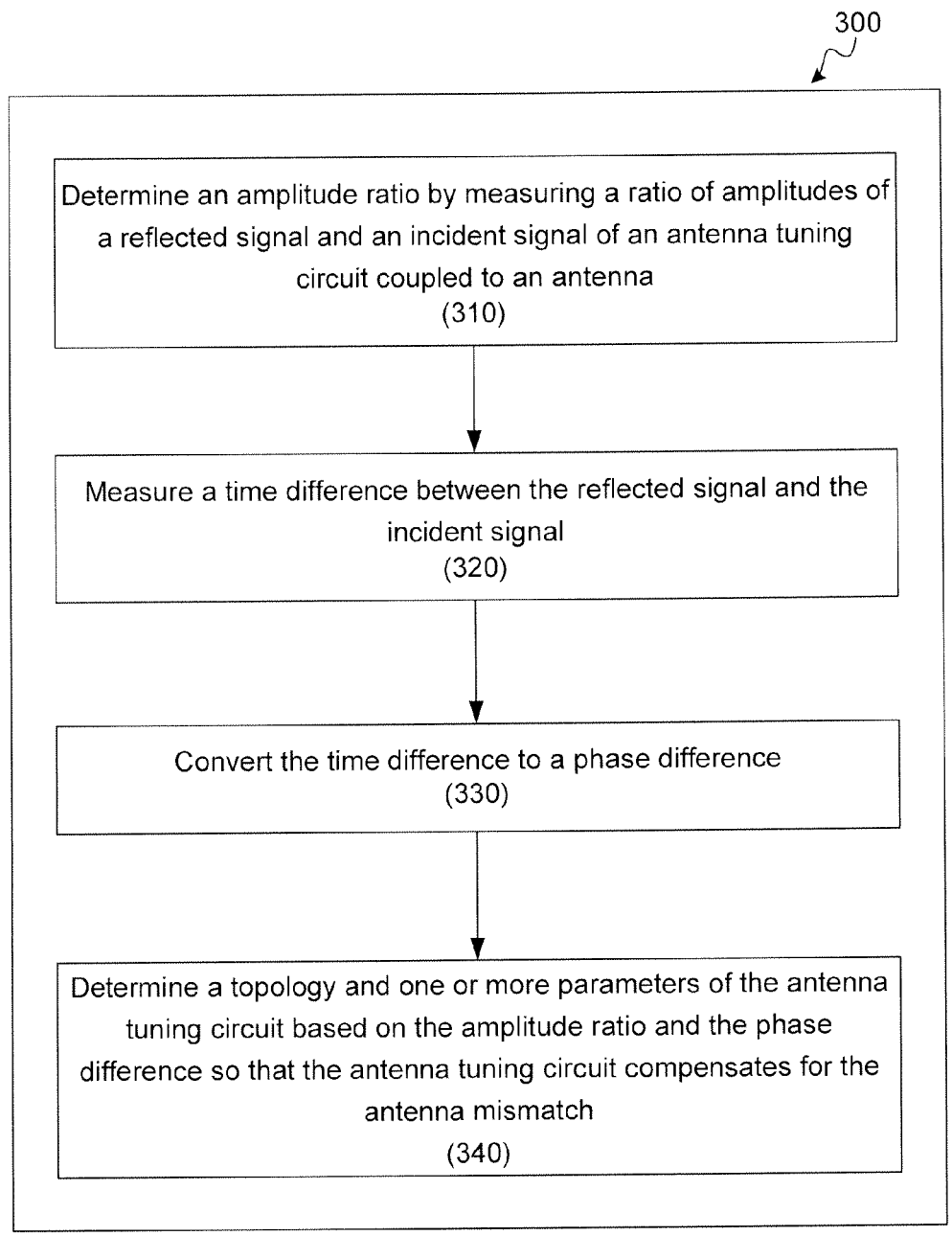
FIG. 3 illustrates an example method for antenna mismatch compensation in accordance with one or more implementations.

FIG. 3 illustrates an example method 300 for antenna mismatch compensation in accordance with one or more implementations of the subject technology. The method 300 may begin at operation block 310, where an amplitude ratio may be determined by measuring (e.g., using 130 of FIG. 1A) a ratio of amplitudes of a reflected signal and an incident signal of an antenna tuning circuit (e.g., using 140 of FIG. 1A) coupled to an antenna (e.g., 150 of FIG. 1A). At operation block 320, a time difference between the reflected signal (e.g., Vr of FIG. 1B) and the incident signal (e.g., Vi of FIG. 1B) may be measured (e.g., using 160 of FIG. 1A). The time difference may be converted, at operation block 330, to a phase difference (e.g., using 170 of FIG. 1A). At operation block 340, a topology (e.g., T-network in 240 or Π-network in 242 of FIGS. 2A and 2B) and one or more parameters (e.g., values of capacitors C1, C2, and C3 of FIG. 2C) of the antenna tuning circuit (e.g., 244 of FIG. 2C or 140 of FIG. 1A) may be determined based on the amplitude ratio and the phase difference so that the antenna tuning circuit compensates for the antenna mismatch.

Those of skill in the art would appreciate that the various illustrative blocks, modules, elements, components, and methods described herein may be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A device for an antenna mismatch compensation, the device comprising:
    an amplitude ratio circuit configured to determine an amplitude ratio by measuring a ratio of amplitudes of a reflected signal and an incident signal of an antenna tuning circuit coupled to an antenna;
    a time-to-digital converter (TDC) configured to measure a time difference between the reflected signal and the incident signal; and
    a processor configured to:
        convert the time difference to a phase difference; and
        determine a topology and one or more parameters of the antenna tuning circuit based on the amplitude ratio and the phase difference so that the antenna tuning circuit compensates for the antenna mismatch.

2. The device of claim 1, wherein the amplitude ratio circuit comprises a coupler connected between an input of the antenna tuning circuit and a duplexer coupled to a power amplifier of a transmitter circuit, and wherein the coupler is used to measure the ratio of amplitudes by facilitating measuring the amplitudes of the incident signal and the reflected signal of the antenna tuning circuit at a coupled port and an isolated port of the coupler, respectively.

3. The device of claim 2, wherein the TDC is coupled between the coupled port and the isolated port of the coupler, and wherein time difference is measured by coupling a start input of the TDC to the coupled port and a stop input of the TDC to the isolated port of the coupler.

4. The device of claim 3, further comprising a gain stage coupled between the isolated port of the coupler and the stop input of the TDC, and configured to amplify an amplitude of the reflected signal.

5. The device of claim 2, wherein the amplitude ratio circuit further comprises power detectors and a combiner circuit configured to measure the ratio of amplitudes, wherein the power detectors comprise at least one of a linear or logarithmic power detector, and wherein the combiner circuit comprises at least one of a subtraction circuit or a divider circuit.

6. The device of claim 1, wherein the processor is configured to determine an input impedance of the antenna tuning circuit coupled to the antenna, based on the amplitude ratio and the phase difference.

7. The device of claim 6, wherein the processor is further configured to:
    use the determined input impedance of the antenna tuning circuit coupled to the antenna to determine an impedance of the antenna; and
    determine an impedance of the antenna tuning circuit that provides the best matching based on the determined impedance of the antenna.

8. The device of claim 7, wherein the processor is configured to determine the topology and the one or more parameters of the antenna tuning circuit based on the determined impedance of the antenna tuning circuit that provides the best matching, and wherein one or more parameters of the antenna tuning circuit comprise capacitance values of a number of capacitors of the antenna tuning circuit.

9. A wireless transmitter comprising:
    a radio-frequency (RF) antenna coupled via a duplexer to an antenna tuning circuit;
    a device for an antenna mismatch compensation, the device comprising:
        an amplitude ratio circuit configured to determine an amplitude ratio by measuring a ratio of amplitudes of a reflected signal and an incident signal of the antenna tuning circuit coupled to the RF antenna;
        a time-to-digital converter (TDC) configured to measure a time difference between the reflected signal and the incident signal; the TDC being calibrated to provide a phase difference corresponding to the measured time difference; and
        a processor configured to determine a topology and one or more parameters of the antenna tuning circuit based on the amplitude ratio and the phase difference so that the antenna tuning circuit compensates for the antenna mismatch.

10. The wireless transmitter of claim 9, wherein the amplitude ratio circuit comprises:
    a coupler connected between an input of the antenna tuning circuit and the duplexer, and wherein the coupler is used to measure the ratio of amplitudes by facilitating measuring the amplitudes of the incident signal and the reflected signal of the antenna tuning circuit at a coupled port and an isolated port of the coupler, respectively, and
    power detectors and a combiner circuit configured to measure the ratio of amplitudes, wherein the power detectors comprise at least one of a linear or logarithmic power detector, and wherein the combiner circuit comprises at least one of a subtraction circuit or a divider circuit.

11. The wireless transmitter of claim 10, wherein:
    the TDC is coupled between the coupled port and the isolated port of the coupler, and the time difference is measured by coupling a start input of the TDC to the coupled port and a stop input of the TDC to the isolated port of the coupler, and
    the wireless transmitter further comprises a gain stage coupled between the isolated port of the coupler and the stop input of the TDC, and configured to amplify an amplitude of the reflected signal.

12. The wireless transmitter of claim 9, wherein the processor is configured to:
    determine an input impedance of the antenna tuning circuit coupled to the antenna, based on the amplitude ratio and the phase difference;
    use the determined input impedance of the antenna tuning circuit coupled to the antenna to determine an impedance of the antenna;
    determine an impedance of the antenna tuning circuit that provides the best matching based on the determined impedance of the antenna; and determine the topology and the one or more parameters of the antenna tuning circuit based on the determined impedance of the antenna tuning circuit that provides the best matching, and wherein one or more parameters of the antenna tuning circuit comprise capacitance values of a number of capacitors of the antenna tuning circuit.

13. A method for an antenna mismatch compensation, the method comprising:

determining an amplitude ratio by measuring a ratio of amplitudes of a reflected signal and an incident signal of an antenna tuning circuit coupled to an antenna;

measuring a time difference between the reflected signal and the incident signal;

converting the time difference to a phase difference; and determining a topology and one or more parameters of the antenna tuning circuit based on the amplitude ratio and the phase difference so that the antenna tuning circuit compensates for the antenna mismatch, wherein the time difference between the reflected signal and the incident signal is measured by a time-to-digital converter (TDC).

14. The method of claim 13, wherein measuring the ratio of amplitudes comprises using a coupler connected between an input of the antenna tuning circuit and a duplexer coupled to a power amplifier of a transmitter circuit, and wherein measuring the ratio of amplitudes further comprises measuring the amplitudes of the incident signal and the reflected signal of the antenna tuning circuit at a coupled port and an isolated port of the coupler, respectively.

15. The method of claim 14, wherein measuring the time difference comprises coupling the time-to-digital converter (TDC) between the coupled port and the isolated port of the coupler, and wherein measuring the time difference further comprises coupling a start input of the TDC to the coupled port and a stop input of the TDC to the isolated port of the coupler.

16. The method of claim 15, further comprising coupling a gain stage between the isolated port of the coupler and the stop input of the TDC.

17. The method of claim 14, wherein measuring the ratio of amplitudes further comprises using power detectors and a combiner circuit, wherein using the power detectors comprise using at least one of a linear or a logarithmic power detector, and wherein using the combiner circuit comprises using at least one of a subtraction circuit or a divider circuit.

18. The method of claim 13, further comprising determining an input impedance of the antenna tuning circuit coupled to the antenna, based on the amplitude ratio and the phase difference.

19. The method of claim 18, further comprising:

using the determined input impedance of the antenna tuning circuit coupled to the antenna to determine an impedance of the antenna; and determining an impedance of the antenna tuning circuit that provides the best matching based on the determined impedance of the antenna.

20. The method of claim 19, wherein determining the topology and the one or more parameters of the antenna tuning circuit is based on the determined impedance of the antenna tuning circuit that provides the best matching, and wherein one or more parameters of the antenna tuning circuit comprise capacitance values of a number of capacitors of the antenna tuning circuit.

* * * * *